(12) United States Patent
Fukuda et al.

(10) Patent No.: US 9,609,208 B2
(45) Date of Patent: Mar. 28, 2017

(54) IMAGE GENERATION METHOD, IMAGE GENERATION APPARATUS, PROGRAM, AND STORAGE MEDIUM

(71) Applicant: CANON KABUSHIKI KAISHA, Tokyo (JP)

(72) Inventors: Koichi Fukuda, Tokyo (JP); Masafumi Kimura, Kawasaki (JP); Koshi Hatakeyama, Tokyo (JP); Norihito Hiasa, Utsunomiya (JP); Shohei Tsutsumi, Yokohama (JP); Tomohiro Nishiyama, Kawasaki (JP); Kazuhiro Yahata, Kunitachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/130,367

(22) Filed: Apr. 15, 2016

(65) Prior Publication Data
US 2016/0234435 A1 Aug. 11, 2016

Related U.S. Application Data

(63) Continuation of application No. 14/370,417, filed as application No. PCT/JP2012/082116 on Dec. 5, 2012, now Pat. No. 9,344,624.

(30) Foreign Application Priority Data

Jan. 13, 2012 (JP) ................................ 2012-005661

(51) Int. Cl.
*H04N 5/232* (2006.01)
*H04N 5/369* (2011.01)
*H04N 5/225* (2006.01)
*G02B 7/34* (2006.01)

(52) U.S. Cl.
CPC ......... *H04N 5/23232* (2013.01); *G02B 7/346* (2013.01); *H04N 5/2254* (2013.01); *H04N 5/23212* (2013.01); *H04N 5/23296* (2013.01); *H04N 5/369* (2013.01)

(58) Field of Classification Search
CPC .................................................. H04N 13/0011
USPC ....................................................... 348/222.1
See application file for complete search history.

(56) References Cited

U.S. PATENT DOCUMENTS

2011/0129165 A1 6/2011 Lim et al.

FOREIGN PATENT DOCUMENTS

CN 101310539 A 11/2008
CN 101610353 A 12/2009

OTHER PUBLICATIONS

Chinese Office Action issued on Nov. 1, 2016, with an English Translation that issued in the corresponding Chinese Patent Application No. 201280066884.X.

*Primary Examiner* — Joel Fosselman
(74) *Attorney, Agent, or Firm* — Cowan, Liebowitz & Latman, P.C.

(57) ABSTRACT

An image generation method is provided for generating an output image from an input image acquired by an image sensor that has an array of multiple pixels, each of which has arranged therein multiple sub-pixels that each receive a light beam that passes through a different pupil sub-area of an imaging optical system. The method includes a step of generating multiple parallax images that respectively correspond to the different pupil sub-areas; a step of generating multiple pixel shifted images by performing different shifting for each of the parallax images according to a virtual image forming plane of the imaging optical system; and a step of generating an output image that has a higher resolution than the resolution of the parallax images from the pixel shifted images through composition processing.

9 Claims, 10 Drawing Sheets

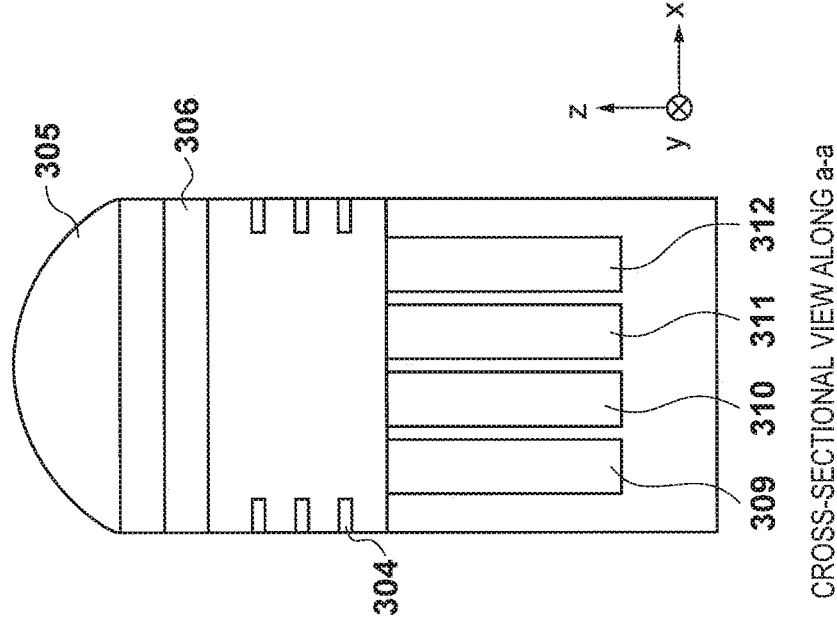
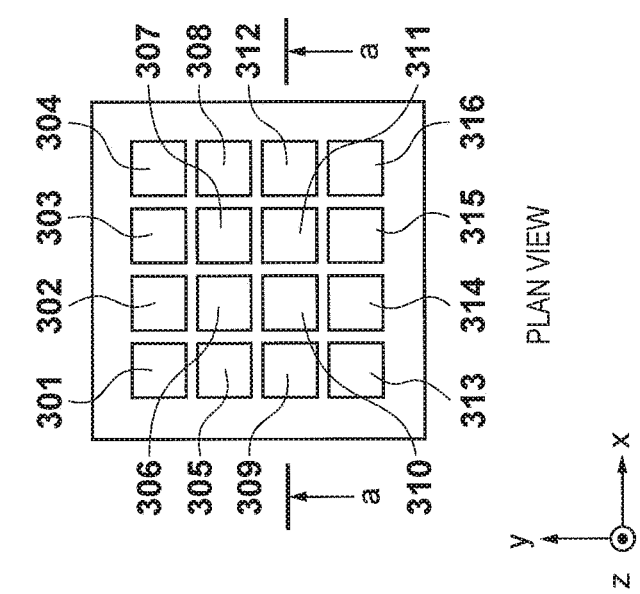

FIG. 10

$$\begin{pmatrix} \cdots & L_{4(i-1)} & L_{4(i-1)+1} & L_{4(i-1)+2} & L_{4(i-1)+3} & L_{4i} & L_{4i+1} & L_{4i+2} & L_{4i+3} & L_{4(i+1)} & L_{4(i+1)+1} & L_{4(i+1)+2} & L_{4(i+1)+3} & \cdots \end{pmatrix}$$

$$\begin{pmatrix}
\cdot & \cdot & \cdot & \cdot & \cdot & \cdot & \cdot & \cdot & \cdot & \cdot & \cdot & \cdot & \cdot & \cdot \\
\cdot & 0 & 0 & 0 & 0 & 0 & 0 & 0 & 0 & 0 & 1 & 1 & 1 & \cdot \\
\cdot & 0 & 0 & 0 & 0 & 0 & 0 & 0 & 0 & 1 & 1 & 1 & 1 & \cdot \\
\cdot & 0 & 0 & 0 & 0 & 0 & 0 & 0 & 1 & 1 & 1 & 1 & 1 & \cdot \\
\cdot & 0 & 0 & 0 & 0 & 0 & 0 & 1 & 1 & 1 & 1 & 1 & 0 & \cdot \\
\cdot & 0 & 0 & 0 & 0 & 0 & 1 & 1 & 1 & 1 & 1 & 0 & 0 & \cdot \\
\cdot & 0 & 0 & 0 & 0 & 1 & 1 & 1 & 1 & 1 & 0 & 0 & 0 & \cdot \\
\cdot & 0 & 0 & 0 & 1 & 1 & 1 & 1 & 1 & 0 & 0 & 0 & 0 & \cdot \\
\cdot & 0 & 0 & 1 & 1 & 1 & 1 & 1 & 0 & 0 & 0 & 0 & 0 & \cdot \\
\cdot & 0 & 1 & 1 & 1 & 1 & 1 & 0 & 0 & 0 & 0 & 0 & 0 & \cdot \\
\cdot & 1 & 1 & 1 & 1 & 1 & 0 & 0 & 0 & 0 & 0 & 0 & 0 & \cdot \\
\cdot & 1 & 1 & 1 & 1 & 0 & 0 & 0 & 0 & 0 & 0 & 0 & 0 & \cdot \\
\cdot & 1 & 1 & 1 & 0 & 0 & 0 & 0 & 0 & 0 & 0 & 0 & 0 & \cdot \\
\cdot & \cdot & \cdot & \cdot & \cdot & \cdot & \cdot & \cdot & \cdot & \cdot & \cdot & \cdot & \cdot & \cdot
\end{pmatrix} \times \frac{1}{4}$$

$$= \begin{pmatrix} \cdots & L_{4(i-1)} & L_{4(i-1)+1} & L_{4(i-1)+2} & L_{4(i-1)+3} & L_{4i} & L_{4i+1} & L_{4i+2} & L_{4i+3} & L_{4(i+1)} & L_{4(i+1)+1} & L_{4(i+1)+2} & L_{4(i+1)+3} & \cdots \end{pmatrix}$$

$$= \begin{pmatrix} \cdots & L_{i-1,0} & L_{i-1,1} & L_{i-1,2} & L_{i-1,3} & L_{i,0} & L_{i,1} & L_{i,2} & L_{i,3} & L_{i+1,0} & L_{i+1,1} & L_{i+1,2} & L_{i+1,3} & \cdots \end{pmatrix}$$

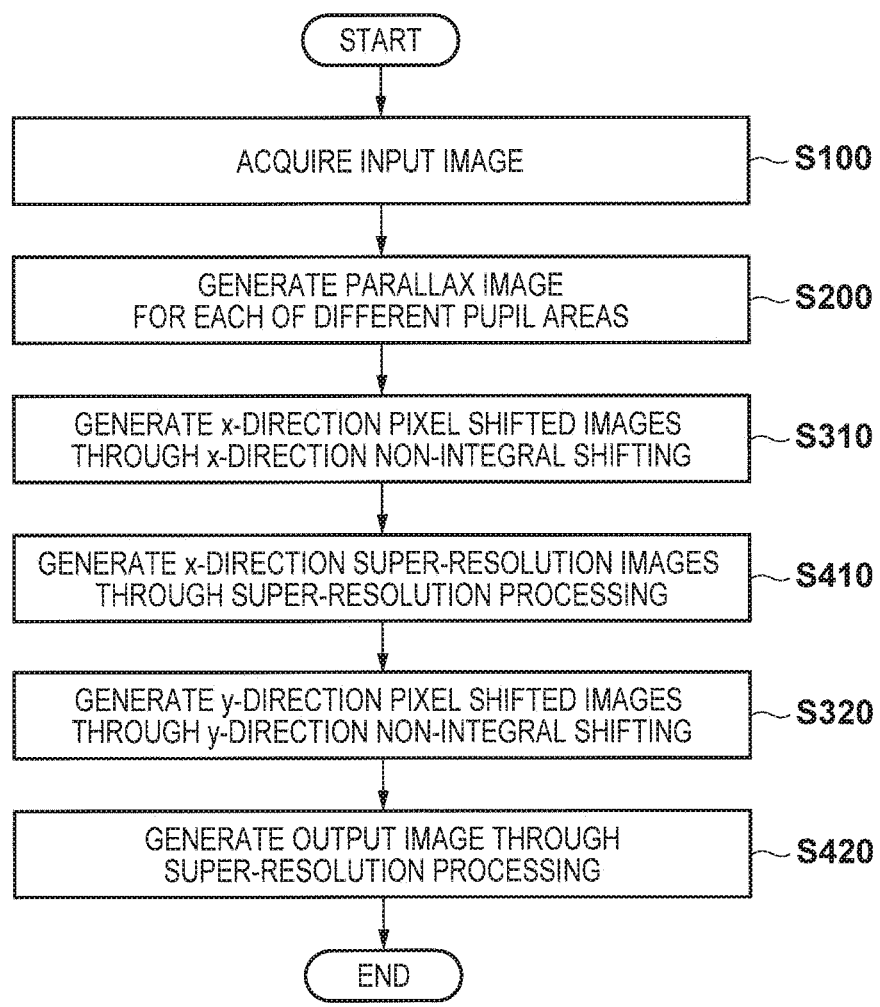

IMAGE GENERATION METHOD, IMAGE GENERATION APPARATUS, PROGRAM, AND STORAGE MEDIUM

CROSS-REFERENCE TO RELATED APPLICATIONS

This application is a continuation of application Ser. No. 14/370,417, filed Jul. 2, 2014, which is a national stage application of International Application No. PCT/JP2012/082116, filed Dec. 5, 2012, whose benefit is claimed and which claims the benefit of Japanese Patent Application No. 2012-005661, filed Jan. 13,2012, whose benefit is also claimed, the entire disclosure of which is hereby incorporated by reference.

TECHNICAL FIELD

The present invention relates to an image generation method, and an image generation apparatus.

BACKGROUND ART

An image capture apparatus has been proposed in which the exit pupil of the imaging lens is divided into multiple pupil areas, and multiple parallax images corresponding to the divided pupil areas can be captured at the same time.

U.S. Pat. No. 4,410,804 discloses an image capture apparatus that uses a two-dimensional image Sensor in which one microlens and multiple divided photo-electric converters are formed with respect to one pixel. The divided photo-electric converters are configured so as to receive light from different pupil sub-areas of the exit pupil of the imaging lens via one microlens, and thus pupil division is performed. Multiple parallax images that correspond to the divided. pupil sub-areas can be generated from the signals obtained due to light, reception in the divided photo-electric converters. Japanese Patent Laid-Open No. 2001-083407 discloses the generation of a captured image by adding together all of the signals obtained due to light reception in the divided photo-electric converters.

The multiple parallax images that are captured are equivalent to light field (LF) data, which is information on a spatial distribution of light intensity and an angle distribution. Stanford Tech Report CTSR 2005-02, 1 (2005) discloses refocusing technology in which the focal position of a captured image is modified after capturing by composting an image at a virtual image forming plane that is different from the image sensing plane Using LF data that has been acquired.

However, although multiple parallax images can be acquired at the same time in the above-described conventional examples due to dividing the exit pupil of the imaging lens into multiple areas, there is the problem of a reduction in the spatial resolution of the captured image that is generated from the parallax images.

SUMMARY OF INVENTION

The present invention was achieved in view of the above-described problems, and generates a captured image that has a high spatial resolution from multiple parallax images.

An image generation method according to a first aspect of the present invention is an image generation method for generating an output image from an input image acquired by an image sensor that has an array of a plurality of pixels, each of which has arranged therein a plurality of sub-pixels that each receive a light beam that passes through a different pupil sub-area of an imaging optical system, the method including: a step of generating a plurality of parallax images that respectively correspond to the different pupil sub-areas based on the input image; a step of generating a plurality of pixel shifted images by performing different non-integral shifting for each of the plurality of parallax images according to a virtual image forming plane of the imaging optical system that is different from an image sensing plane at which the image sensor is arranged; and a step of generating an output image that has a higher resolution than each of the resolutions of the plurality of parallax images from the plurality of pixel shifted images through composition processing.

Also, according to a second aspect of the present invention, a program causes a computer to execute the steps of the above-described image generation method.

Also, according to a third, aspect of the present invention, a computer-readable storage medium stores a program for causing a computer to execute the steps of the above-described image generation method.

Also, according to a fourth aspect of the present invention, an image generation apparatus comprises an image sensor configured to acquire an input image, wherein the image sensor has an array of a plurality of pixels, each of which has arranged therein a plurality of sub-pixels that each receive a light beam that passes through a different pupil sub-area of an imaging optical system; a first generation means configured to generate a plurality of parallax images that respectively correspond to the different pupil sub-areas based on the input image; a second generation means configured to generate a plurality of pixel shifted images by performing different shifting for each of the plurality of parallax images according to a virtual image forming plane of the imaging system that is different from an image sensing plane at which the image sensor is arranged; and a composition means configured to generate an output image that has a higher resolution than the resolution of the parallax images from the plurality of pixel shifted images through composition processing.

Further features of the present invention will become apparent from the following description of exemplary embodiments with reference to the attached drawings.

BRIEF DESCRIPTION OF DRAWINGS

FIGS. 3A and 3B are a schematic plan view and a schematic cross-sectional view of a pixel according to embodiments of the present invention.

FIG. 10 shows an example of a relational expression between an output image and a pixel shifted image according to embodiments of the present invention.

FIG. 11 is a flowchart of image generation according to a second embodiment of the present invention.

DESCRIPTION OF EMBODIMENTS

Embodiments of the present invention will be described below in detail with reference to the accompanying drawings.

First Embodiment

Figure 1:
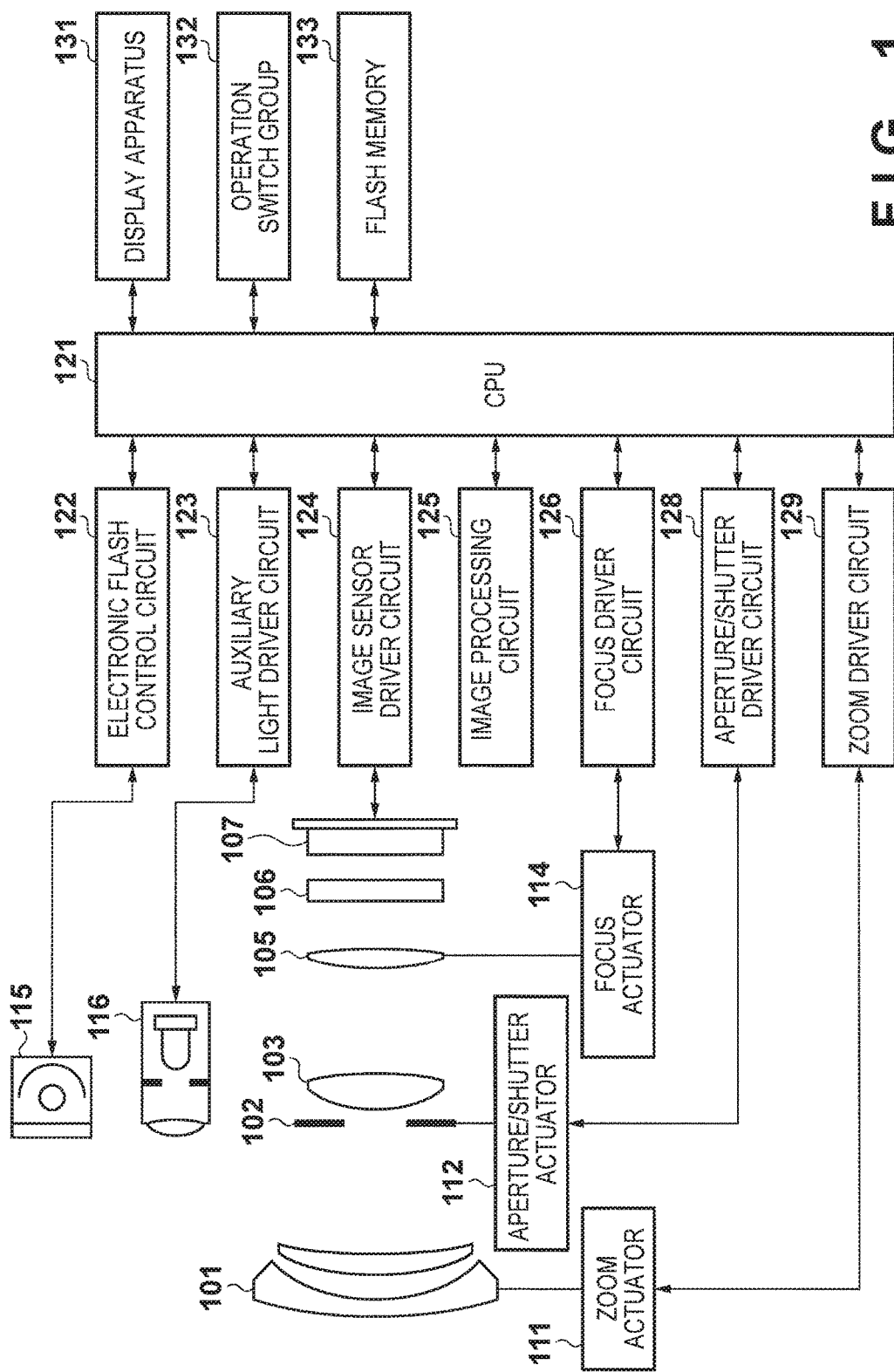
FIG. 1 is a schematic configuration diagram of an image capture apparatus according to embodiments of the present invention.

FIG. 1 is a configuration diagram of a camera as an image capture apparatus that has an image sensor according to a first embodiment of the present invention. In FIG. 1, reference numeral 101 denotes a first lens group arranged at the leading end of an imaging optical system, and this lens group is held so as to be capable of moving forward and backward in the optical axis direction. Reference numeral 102 denotes an aperture/shutter that not only adjusts the amount of light in image capturing by performing opening diameter adjustment, but also functions as a shutter for adjusting the light exposure time in still image capturing. Reference numeral 103 denotes a second lens group. The second lens group 103 can move forward and backward in the optical axis direction together with the aperture/shutter 102, and realizes a magnification effect (zoom function) by moving in conjunction with forward/backward movement of the first lens group 101.

Reference numeral 105 denotes a third lens group that adjusts the focal point by moving forward and backward in the optical axis direction. Reference numeral 106 denotes an optical low-pass filter, which is an optical element for reducing false coloring and moiré that appear in captured images. Reference numeral 107 denotes an image sensor configured by a two-dimensional CMOS photosensor and peripheral circuitry, and this image sensor is arranged at the image forming plane of the imaging optical system.

Reference numeral 111 denotes a zoom actuator that performs a magnification operation by driving elements from the first lens group 101 to the third lens group 105 in the optical axis direction by rotating a cam barrel (not shown). Reference numeral 112 denotes an aperture/shutter actuator that adjusts the amount of captured light by controlling the opening diameter of the aperture/shutter 102, as well as controls the light exposure time in still image capturing. Reference numeral 114 denotes a focus actuator that adjusts the focal point by driving the third lens group 105 forward and backward in the optical axis direction.

Reference numeral 115 denotes an electronic flash for subject illumination in image capturing, and is preferably a flash illumination apparatus that uses a xenon tube, but may be an illumination apparatus that includes a continuous-emission LED. Reference numeral 116 denotes an AF auxiliary light apparatus that projects a mask image having a predetermined pattern of openings into the subject field via a projection lens so as to improve focus detection capability with respect to dark subjects and low-contrast subjects.

Reference numeral 121 denotes a CPU in the camera that performs various types of control with respect to the camera body, has an arithmetic portion, a ROM, a RAM, an A/D converter, a D/A converter, a communication interface circuit, and the like, and drives various circuits in the camera based on a predetermined program stored in the ROM. This CPU also executes a series of operations such as AF, image capturing, image generation, and recording. The CPU 121 is an image generation means, a parallax image generation means, a pixel shifted image generation means, and a super-resolution processing means of the present invention.

Reference numeral 122 denotes an electronic flash control circuit that performs control for lighting the electronic flash 115 in synchronization with an image capturing operation. Reference numeral 123 denotes an auxiliary light driver circuit that performs control for lighting the AF auxiliary light apparatus 116 in synchronization with a focus detection operation. Reference numeral 124 denotes an image sensor driver circuit that controls image capturing operations of the image sensor 107, as well as subjects an acquired image signal to A/D conversion and transmits the converted image signal to the CPU 121. Reference numeral 125 denotes an image processing circuit that performs processing such as γ conversion, color interpolation, and JPEG compression on an image that was acquired by the image sensor 107.

Reference numeral 126 denotes a focus driver circuit that adjusts the focal point by performing control for driving the focus actuator 114 based on a focus detection result so as to move the third lens group 105 forward and backward in the optical axis direction. Reference numeral 128 denotes an aperture/shutter driver circuit that controls the opening diameter of the aperture/shutter 102 by performing control for driving the aperture/shutter actuator 112. Reference numeral 129 denotes a zoom driver circuit that drives the zoom actuator 111 in accordance with a zoom operation that was performed by a photographer.

Reference numeral 131 denotes a display apparatus such as an LCD that displays information regarding the camera shooting mode, a preview image before image capturing, an image for checking after image capturing, an image indicating the focus state in focus detection, and the like. Reference numeral 132 denotes an operation switch group that is configured by a power switch, a release (shooting trigger) switch, a zoom operation switch, a shooting mode selection switch, and the like. Reference numeral 133 denotes a removable flash memory that records captured images.

Figure 2:
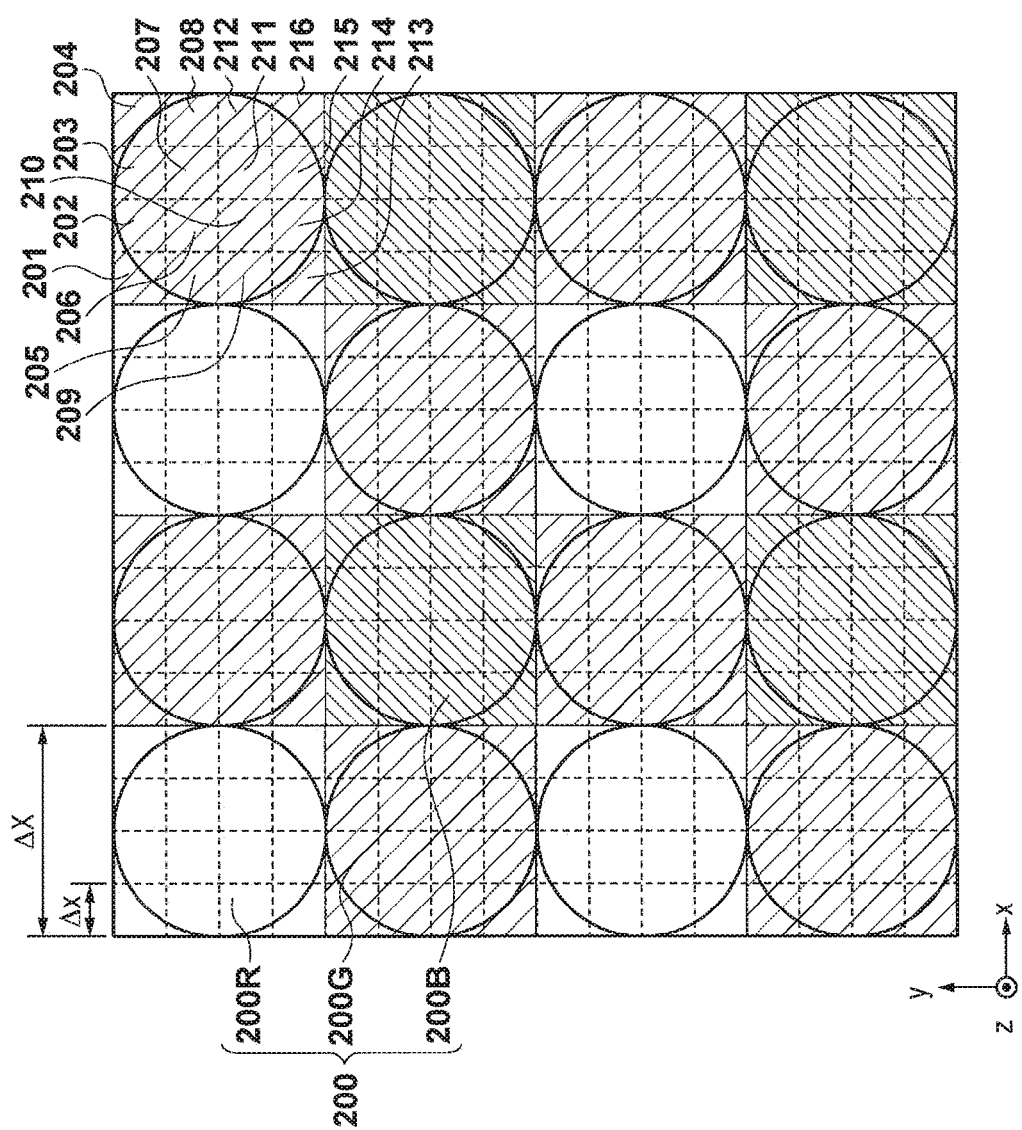
FIG. 2 as a schematic diagram of a pixel array according to embodiments of the present invention.

FIG. 2 is a schematic diagram of a pixel array and a sub-pixel array in the image sensor of the present embodiment.

FIG. 2 shows a 4×4 pixel array range in the pixel array and a 16×16 sub-pixel array range in the sub-pixel array in the two-dimensional CMOS sensor (image sensor) of the present embodiment. Many of the 4×4 pixel arrays (16×16 sub-pixel arrays) shown in FIG. 2 are arranged on the surface to make the acquisition of an image possible. The present embodiment describes an image sensor that has a pixel period $\Delta X$ of 20 μm and an effective pixel count NLF of approximately 2.2 million pixels (1,800 columns horizontally×1,200 rows vertically), that is to say, a sub-pixel period $\Delta x$ of 5 μm and an effective sub-pixel count N of approximately 34.6 million pixels (7,200 columns horizontally×4,800 rows vertically).

In the first embodiment, in a 2×2 pixel group 200 shown in FIG. 2, pixels 200G that have G (green) spectral sensitivity are arranged as pixels at diagonal positions, and a pixel 200R that has R (red) spectral sensitivity and a pixel 200B that has B (blue) spectral sensitivity are arranged as the other two pixels. Furthermore, Nθ×Nθ (a 4×4 array of) sub-pixels 201 to 216 are arranged in a two-dimensional array in each pixel.

FIG. 3A is a plan view of one of the pixels 200G in the image sensor shown in FIG. 2 as viewed from the light receiving face side (+z side) of the image sensor, and FIG.

3B is a cross-sectional view of the same pixel taken along a-a in FIG. 3A and viewed from the −y side.

As shown in FIGS. 3A and 3B, the pixel 200G of the present embodiment is provided with a microlens 305 for focusing incident light on the light-receiving side of the pixel, and is provided with photo-electric converters 301 to 316 that are divided into NΘ areas (four areas) in the x direction and NΘ areas (four areas) in the y direction. The photo-electric converters 301 to 316 respectively correspond to the sub-pixels 201 to 216 in FIG. 2.

The photo-electric converters 301 to 316 may be pin-structure photodiodes in which an intrinsic layer is sandwiched between a p layer and an n layer, or, as necessary, may be pn-junction photodiodes in which the intrinsic layer is omitted.

In each pixel, a color filter 306 is formed between the microlens 305 and the photo-electric converters 301 to 316. Also, for each sub-pixel, the spectral transmittance of the color filter may be changed, or the color filter may be omitted, as necessary.

Light that enters the pixel 200G shown in FIGS. 3A and 3B is focused by the microlens 305, filtered by the color filter 306, and then received by the photo-electric converters 301 to 316.

In each photo-electric converter, pairs of an electron and a hole are generated according to the amount of received light and separated by a depletion layer, and then negatively charged electrons are accumulated in the n layer (not shown), whereas the holes are discharged outside the image sensor via the p layer, which is connected to a constant voltage source (not shown).

Figure 4:
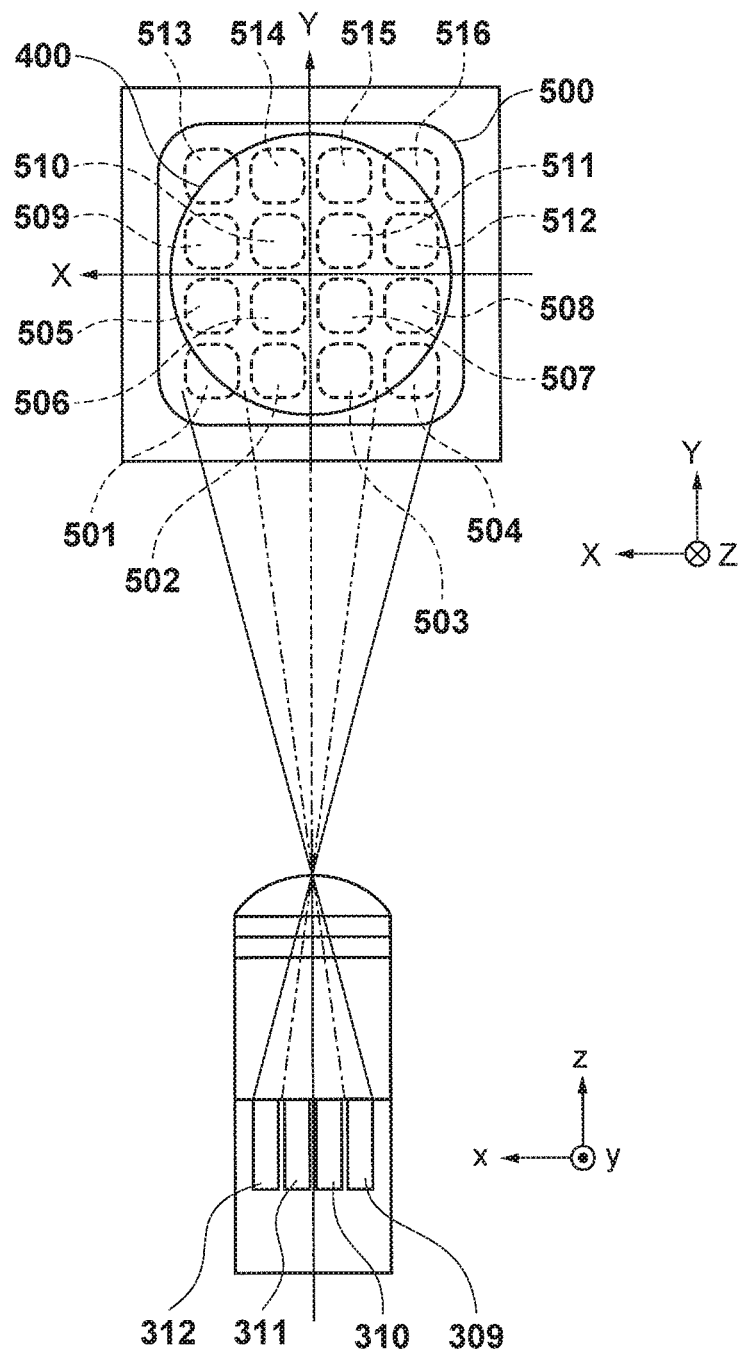
FIG. 4 is a schematic diagram for describing a pixel and pupil division according to embodiments of the present invention.

The following describes a pupil division means of the first embodiment. FIG. 4 is a schematic diagram showing the correspondence relationship between pupil division and the photo-electric converters 301 to 316 (sub-pixels 201 to 216). FIG. 4 is a cross-sectional view of the pixel 200G shown in FIG. 3A taken along a-a and viewed from the +y side, and shows the exit pupil face of the imaging optical system. In FIG. 4, the x axis and the y axis in the cross-sectional view are the opposite of those in FIGS. 3A and 3B in order to correspond to the coordinate axes of the exit pupil face.

The image sensor is arranged in the vicinity of the image forming plane of the imaging lens (imaging optical system), and light beams from a subject pass through an exit pupil 400 of the imaging optical system and enter respective pixels. The plane at which the image sensor is arranged is the image sensing plane. Due to the microlens, pupil sub-areas 501 to 516 are in an approximately conjugate relationship with the light receiving faces of the photo-electric converters 301 to 316 (sub-pixels 201 to 216) that are divided into NΘ×NΘ areas (4×4 areas), and these pupil sub-areas represent pupil sub-areas from which light can be received by the corresponding photo-electric converters (sub-pixels). The exit pupil 400 of the imaging optical system is divided in Np (Np=NΘ×NΘ) different pupil sub-areas, where Np is the pupil division count. Letting F be the aperture value of the imaging optical system, the effective aperture value of pupil sub-areas is approximately NΘF. Also, a pupil area 500 is the pupil area from which the entire pixel 200G can receive light when all of the photo-electric converters 301 to 316 (sub-pixels 201 to 216) that are divided into NΘ×NΘ areas (4×4 areas) are combined.

Figure 5:
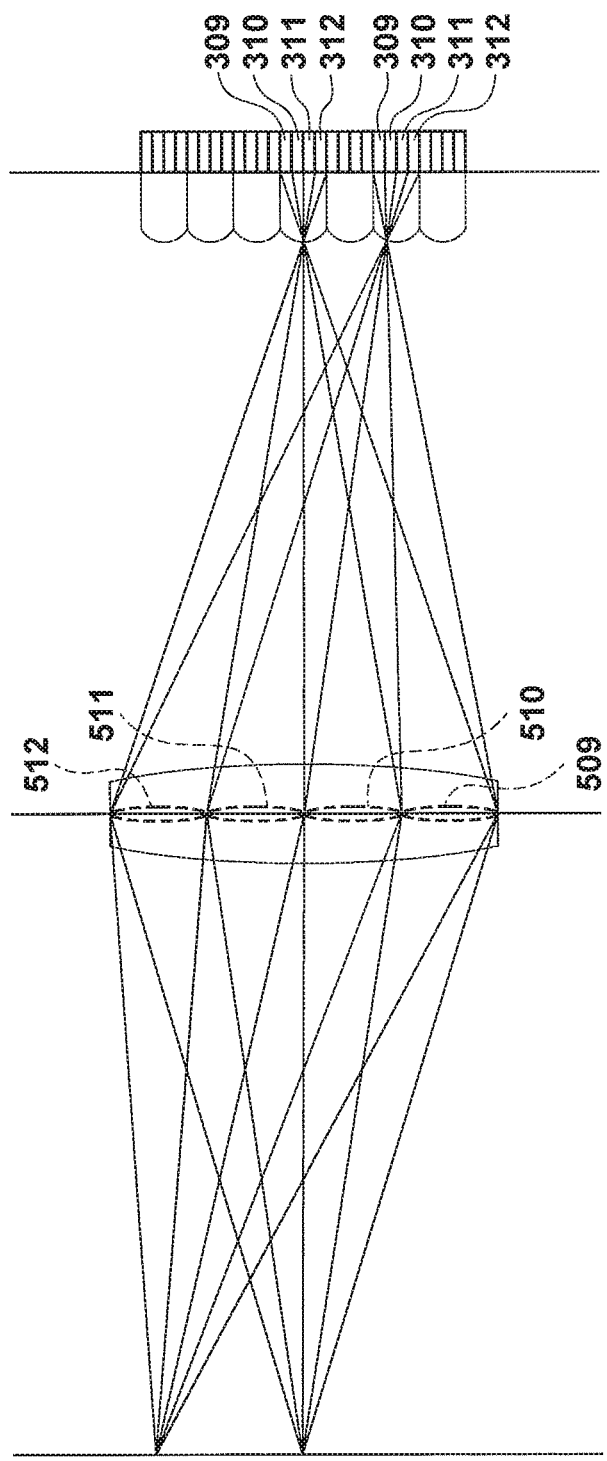
FIG. 5 is a schematic diagram for describing an image sensor and pupil division according to embodiments of the present invention.

The following describes parallax image generation in the present embodiment. FIG. 5 is a schematic diagram showing the correspondence relationship between pupil division and the image sensor of the present embodiment. In each pixel of the image sensor, the photo-electric converters 301 to 316 (sub-pixels 201 to 216) that are divided into NΘ×NΘ areas (4×4 areas) each receive a light beam that passed through a different pupil sub-area among the pupil sub-areas 501 to 516. In the present embodiment, an input image is acquired by the image sensor that has an array of multiple pixels, each of which has arranged therein multiple sub-pixels that each receive a light beam that passes through a different pupil sub-area of the imaging optical system.

A parallax image that corresponds to a specified pupil sub-area among the pupil sub-areas 501 to 516 of the imaging optical system can be obtained by, for each pixel, selecting a signal from a specified sub-pixel among the sub-pixels 201 to 216 (photo-electric converters 301 to 316). For example, a parallax image that corresponds to the pupil sub-area 509 of the imaging optical system can be obtained by selecting the signal from the sub-pixel 209 (photo-electric converter 309) for each pixel. The same follows for the other sub-pixels as well. Based on the input image acquired by the image sensor of the present embodiment, multiple (pupil division count Np) parallax images that respectively correspond to the different pupil sub-areas and have a resolution equal to the effective pixel count can be generated.

Also, a captured image with a resolution equal to the effective pixel count can be generated by adding together all of the signals from the sub-pixels 201 to 216 for each pixel.

Figure 6:
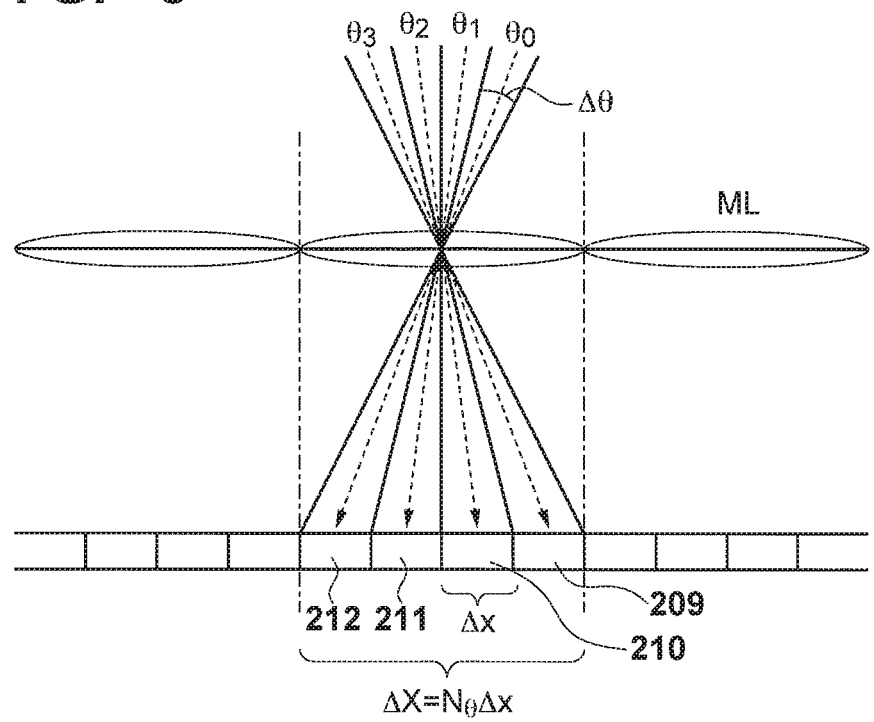
FIG. 6 is a schematic diagram of a relationship between sub-pixels and angle information that can be acquired according to embodiments of the present invention.

The following describes the refocusable range. FIG. 6 is a schematic diagram of the relationship between sub-pixels and angle information that can be acquired according to the present embodiment. Given the sub-pixel period Δx and the number of sub-pixel areas Np=NΘ×NΘ per pixel, the pixel period ΔX is obtained by ΔX=NΘΔx. Here, Δθ is the angular resolution, and letting Θ be the estimated elevation of the exit pupil of the imaging optical system, Δθ=Θ/NΘ is obtained. Using paraxial approximation, where F is the aperture value of the imaging optical system, the relational expression NΘF≈1/Δθ approximately holds. Among all of the light beams that enter the pixels, the sub-pixels 212 to 209 receive light beams that have angles of incidence θ0 to θ3 respectively. Light beams whose angles of incidence have a range of the angular resolution Δθ enter the sub-pixels.

Figure 7:
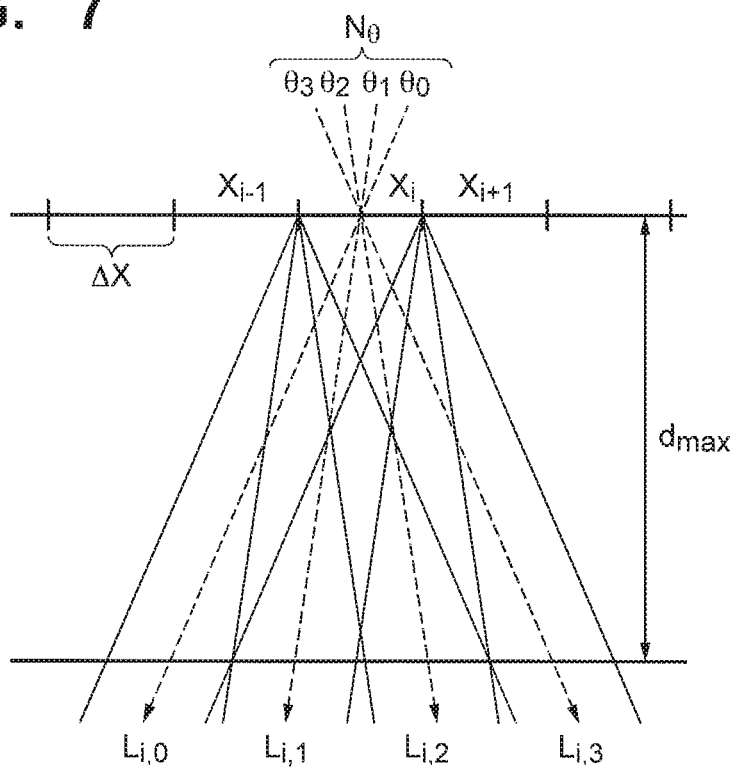
FIG. 7 is a diagram for describing a refocusable range according to embodiments of the present invention.

FIG. 7 is a schematic diagram for describing the refocusable range of the present embodiment. In FIG. 7, pixels Xi (i=0 to NLF−1) of the image sensor arranged at the image sensing plane are illustratively represented by line segments. In the i-th pixel Xi, light beams that entered at the angles θa (a=0 to NΘ−1) are received by the sub-pixels. The signals from the sub-pixels that received light are denoted by Li, a (a=0 to NΘ−1). With the image sensor of the present embodiment, light field (LF) data, which is information on a spatial distribution of light intensity and an angle distribution, can be acquired, and the LF data is constituted by multiple parallax images respectively corresponding to the different pupil sub-areas as described above.

After image capturing, it is possible to generate (perform refocus processing), based on the LF data (multiple parallax images), an image at a virtual image forming plane that is different from the image sensing plane at which the image sensor is arranged and the sub-pixels Li, a were acquired. A refocused image can be generated at a virtual image forming plane by translating all of the sub-pixel signals Li, a along the respective angles θa from the image sensing plane to the virtual image forming plane, distributing the signals to virtual pixels in the virtual image forming plane, and then performing weighted addition. The coefficient used in the weighted addition is determined such that all of the values are positive and have a sum of 1.

There is a limit to a distance (maximum refocus amount) dmax from the image sensing plane to the virtual image forming plane at which refocusing is possible while maintaining a resolution equal to the effective pixel count NLF, and this maximum refocus amount dmax is approximately determined by Expression (1).

$$d_{max} = \frac{\Delta X}{\tan\Delta\theta} \approx N_\theta F \Delta X = N_p F \Delta x \quad (1)$$

As shown in FIG. 7, when the sub-pixel signals Li, a from the pixel Xi are translated along the respective angles θa, the horizontal interval, between the sub-pixel signals Li, a becomes greater than the pixel period ΔX when the maximum refocus amount dmax is exceeded. For this reason, in the case of conventional light transmission, there are areas where information is lost because none of the sub-pixel signals Li, a arrive, regardless of being an area where transmitted light from the pixel Xi should be received.

In the present embodiment, the exit pupil of the imaging optical system having the aperture value F decreases in area upon being divided into Nθ×Nθ pupil areas, and the effective aperture value of the pupil sub-areas increases to NθF. As the focal depth increases, parallax images having a wider focal range can be obtained, and an image at a virtual image forming plane can be composited from these parallax images. The third member in Expression (1) shows that refocusing can be performed in the range in which the effective aperture value NθF of the pupil sub-areas increases and the focal depth increases. Although refocus processing from the image sensing plane in the rearward focus direction has been described, the same follows for refocus processing in the forward focus direction.

Figure 8:
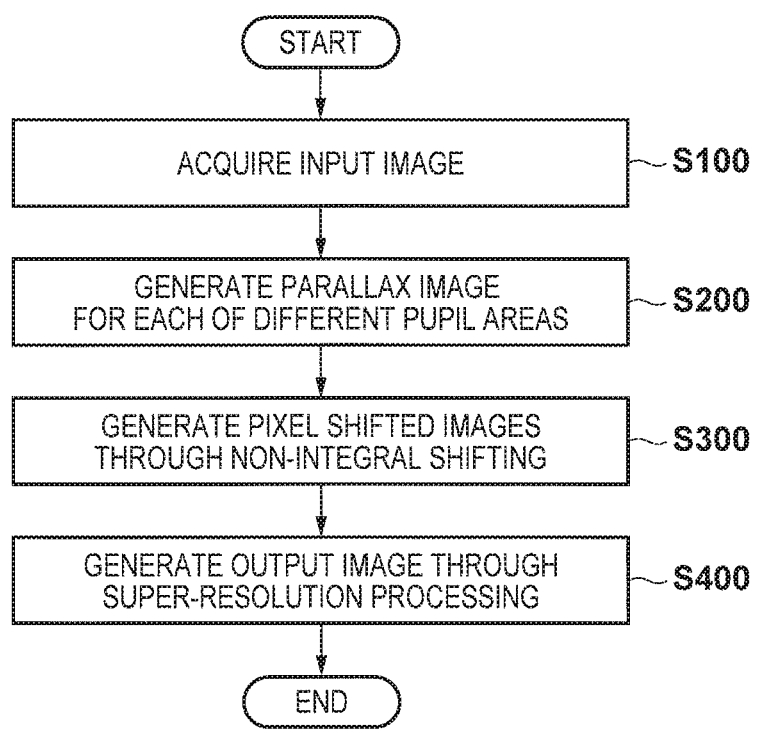
FIG. 8 is a flowchart of image generation according to a first embodiment of the present invention.

The following describes an image processing method for generating an output image from an input image of the present embodiment with reference to the flowchart of FIG. 8. Note that the operations in the flowchart of FIG. 8 are executed by the CPU 121, which is the image generation means, the parallax image generation means, the pixel shifted image generation means, and the super-resolution processing means of the present embodiment.

In step S100, an input image is acquired by the image sensor that has an array of multiple pixels, each of which has arranged therein multiple sub-pixels (the sub-pixels 201 to 216) that each receive a light beam that passes through a different pupil sub-area of the imaging optical system. It is also possible to use an input image that was captured by the image sensor having the above configuration in advance and stored in a recording medium.

In step S200, a parallax image that corresponds to a specified pupil sub-area among the pupil sub-areas 501 to 516 of the imaging optical system is generated by, for each pixel, selecting a signal from a specified sub-pixel among the sub-pixels 201 to 216 from the input image. Based on the input image, multiple parallax images that respectively correspond to the different pupil sub-areas and have a resolution equal to the effective pixel count are generated.

In step S300, multiple pixel shifted images are generated by, for each of the parallax images generated in step S200, performing different non-integral shifting according to a virtual image forming plane of the imaging optical system that is different from the image sensing plane at which the image sensor is arranged.

Figure 9:
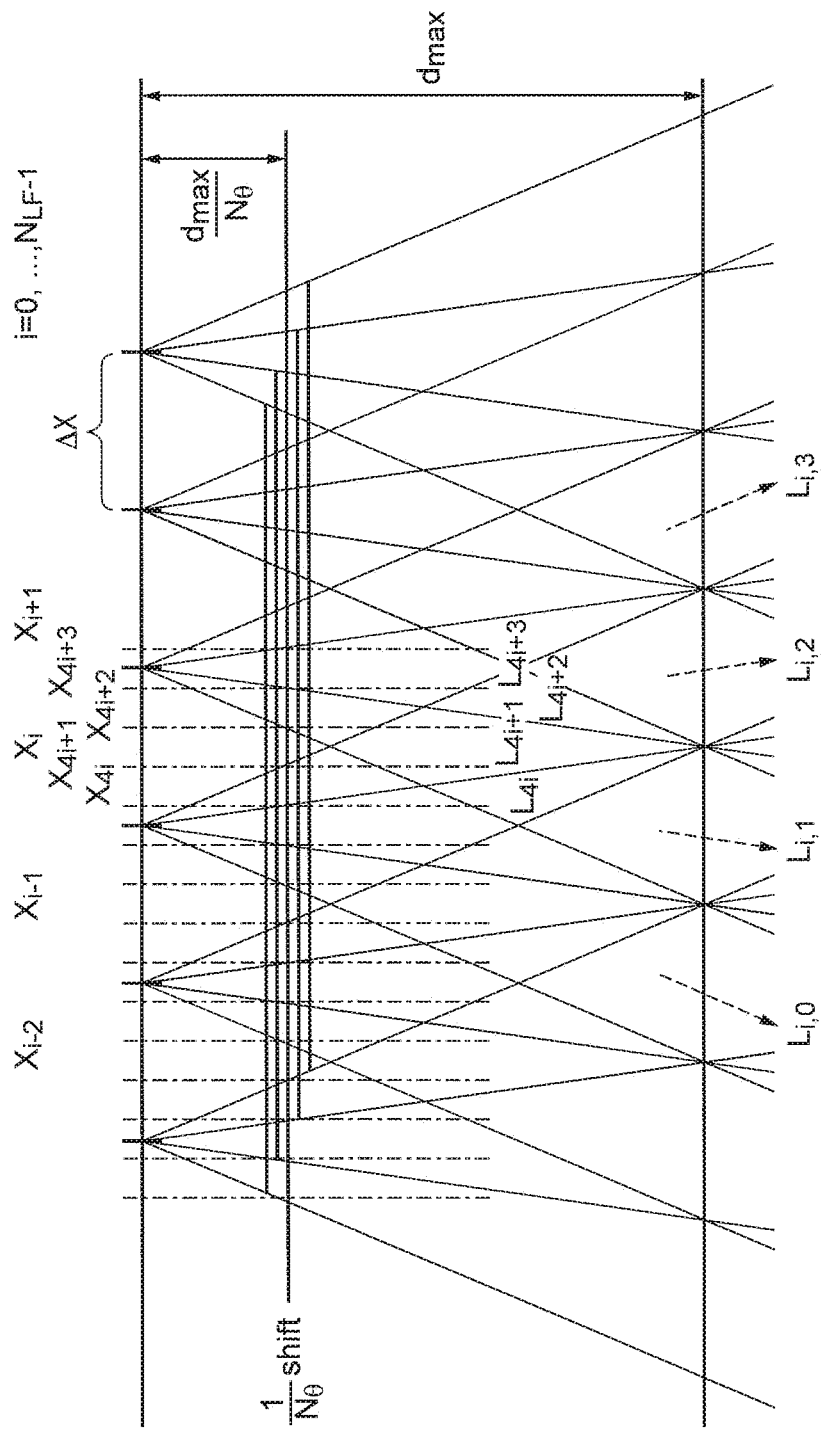
FIG. 9 is a diagram for describing pixel shift in parallax images according to embodiments of the present invention.

FIG. 9 is a diagram for describing pixel shift in parallax images. Although the following describes only the x direction for the sake of simplicity, the same follows for the y direction as well. A light beam that passes through the a-th pupil sub-area and enters the i-th pixel Xi (i=0 to NLF−1) in the x direction on the image sensing plane at the angle θa (a=0 to Nθ−1) is received by the sub-pixels, and thus sub-pixel signals Li, a are obtained. An image is generated by, for each pixel, selecting the sub-pixel signal Li, a that entered at the a-th angle θa, and that image is the parallax image that corresponds to the a-th pupil sub-area.

Since there is no pixel shift in the parallax images at the image sensing plane, pixel shift super-resolution processing cannot be performed while in this state. In view of this, in the present embodiment, multiple pixel shifted images are generated by performing translation along the angle θa for each of the parallax images to a virtual image forming plane that is different from the image sensing plane. At this time, in order to be able to perform pixel shift super-resolution processing using multiple pixel shifted images, a distance d between the image sensing plane and the virtual image forming plane is set such that the amount of shift in the horizontal direction is a non-integer. Also, in order to prevent a reduction in resolution, it is desirable that the distance d between the image sensing plane and the virtual image forming plane is greater than 0 and less than or equal to the maximum refocus amount dmax=NpFΔx.

In the present embodiment, the distance d between the image sensing plane and the virtual image forming plane is set to d=dmax/Nθ=FΔX. As shown in FIG. 9, if the distance d between the image sensing plane and the virtual image forming plane is set to d=dmax/Nθ, and pixel shifting is performed through translation along the angle θa for each of the parallax images, it is possible to generate multiple pixel shifted images in which the amount of shift between the Nθ parallax images in the x direction is uniformly ΔX/Nθ. Since a permissible circle of confusion δ is greater than or equal to the pixel period ΔX (δ≥ΔX), the relation d≤Fδ holds. This enables generating multiple pixel shifted images by performing non-integral shifting (shifting by the non-integral factor 1/Nθ of the pixel period ΔX) for each of the parallax images necessarily within the focal depth Fδ of the imaging optical system.

In step S400, super-resolution processing is performed such that an output image whose resolution is higher than the resolution of each of the parallax images is generated from the multiple pixel shifted images that were generated in step S300.

FIG. 9 shows the relationship in the present embodiment that a super-resolution pixel xμ=xi,a and a super-resolution pixel signal lμ=li,a at the position μ=Nθi+a (4i+a) in the x direction after super-resolution processing have with the pixel Xi and sub-pixel signal, Lμ=Li, a at the i-th position in the x direction before super-resolution processing. At this time, the relational expression of Expression (2) holds between the super-resolution pixel signal lμ and the sub-pixel signal Lμ. A determinant Mμ, μ' is a sparse matrix. Expression (2) is explicitly shown in FIG. 10.

$$L_{\mu=N_\theta i+a} = \sum_{\mu'=0}^{N-1}\left[\frac{1}{N_\theta}\sum_{k=-2}^{1}\delta_{\mu+k,\mu'}\right]l_{\mu'} = \sum_{\mu'=0}^{N-1} M_{\mu,\mu'}l_{\mu'} \quad (2)$$

Expression (2) is a relational expression between the super-resolution pixel signal lμ and the sub-pixel signal Lμ arrayed One-dimensionally. Given $\mu=N\theta i+a$ and $\nu=N\theta j+b$ (i, j=0 to NLF−1; a,b=0 to N$\theta$−1), the relational expression of Expression (3) holds between the super-resolution pixel signal $l\mu, \nu$ and sub-pixel signal $L\mu, \nu$ arrayed two-dimensionally. A determinant $M\mu, \nu, \mu', \nu'$ is a sparse matrix. In the present embodiment, the relational expression of Expression (3) corresponds to the generation of multiple pixel shift images by performing non-integral shifting on each of the parallax images in step S300.

$$L_{i,a,j,b} = L_{\mu,\nu} = \sum_{\mu'=0}^{N-1} \sum_{\nu'=0}^{N-1} \left[ \frac{1}{N_\theta^2} \sum_{h=-2}^{1} \sum_{k=-2}^{1} \delta_{\mu+h,\mu'} \delta_{\nu+k,\nu'} \right] l_{\mu',\nu'} = \sum_{\mu'=0}^{N-1} \sum_{\nu'=0}^{N-1} M_{\mu,\nu,\mu',\nu'} l_{\mu',\nu'} \quad (3)$$

Accordingly, using the inverse matrix $M^{-1}\mu, \nu, \mu', \nu'$ of the determinant $M\mu, \nu, \mu', \nu'$, the relational expression of Expression (4) holds between the super-resolution pixel signal $l\mu, \nu$ and the sub-pixel signal $L\mu, \nu$.

$$l_{u,\nu} = \sum_{\mu'=0}^{N-1} \sum_{\nu'=0}^{N-1} M^{-1}_{\mu,\nu,\mu',\nu'} L_{\mu',\nu'} \quad (4)$$

in step S400, an output image (super-resolution pixel signal $l\mu, \nu$) is generated through super-resolution processing for obtaining the inverse matrix $M^{-1}\mu, \nu, \mu', \nu'$ of the determinant $M\mu, \nu, \mu', \nu'$ and performing compositing using the relational expression of Expression (4). The inverse matrix $M^{-1}\mu, \nu, \mu', \nu'$ may be obtained in advance as necessary.

In the present embodiment, the sampling period in the x direction after super-resolution processing is $\Delta X/N\theta=\Delta x$, which is the same as the sub-pixel period. Accordingly, an output image whose resolution is equal to the effective sub-pixel count (the factor $Np=N\theta \times N\theta$ of the resolution equal to the effective pixel count) can be generated through the super-resolution processing.

A configuration is possible in which, as necessary, the super-resolution pixel signal $l\mu, \nu$, the inverse matrix $M^{-1}\mu, \nu, \mu', \nu'$, and the sub-pixel signal $L\mu, \nu$ in Expressions (3) and (4) are respectively subjected to Fourier transformation, super-resolution processing is performed in the frequency space, and then inverse Fourier transformation is performed.

As necessary, dark correction, shading correction, demosaicing processing, and the like may be performed on one or a combination of the input image, the parallax images, the pixel shifted images, and the output image.

The output image generated through the above-described image generation method is displayed by the display apparatus 131.

The present embodiment is one example of an image capture apparatus that has an image generation means for performing the above-described image generation method. Also, the present embodiment is one example of a display apparatus that has an image generation means for performing the above-described image generation method.

According to the above configuration, a captured image that has a high spatial resolution can be generated from multiple parallax images.

Second Embodiment

The following describes an image processing method for generating an output image from an input image according to a second embodiment of the present invention with reference to the flowchart of FIG. 11. Note that the operations in the flowchart of FIG. 11 are executed by the CPU 121, which is the image generation means, the parallax image generation means, the pixel shifted image generation means, and the super-resolution processing means of the present embodiment.

The processing up to the generation of multiple parallax images that respectively correspond to the different pupil sub-areas and have a resolution equal to the effective pixel count based on the input image in step S200 is similar to that in the first embodiment.

In the present embodiment, first, super-resolution processing in the x direction is performed, and then super-resolution processing in the y direction is performed. Similarly to the first embodiment, the distance d between the image sensing plane and the virtual image forming plane is set to d=dmax/N$\theta$.

First, in step S310, translation along the angle $\theta a$ is performed for each "x direction only" parallax image, and multiple x-direction pixel shifted images are generated by performing X-direction non-integral shifting (shifting by the non-integral factor 1/N$\theta$ of the pixel period $\Delta X$). The relational expression of Expression (5) corresponds to the generation of multiple x-direction pixel shifted images by performing x-direction non-integral shifting on each of the parallax images in step S310.

$$L_{\mu,\nu} = \sum_{\mu'=0}^{N-1} \left[ \frac{1}{N_\theta} \sum_{k=-2}^{1} \delta_{\mu+k,\mu'} \right] l_{\mu',\nu'} = \sum_{\mu'=0}^{N-1} M_{\mu,\mu'} l_{\mu',\nu'} \quad (5)$$

In step S410, multiple x-direction super-resolution images are generated by solving the simultaneous equation of Expression (5) for the super-resolution pixel signal $l\mu, \nu$. Expression (5) can be explicitly described as the recurrence formulas in Expressions (6a) to (6d). The recurrence formulas in Expressions (6a) to (6d) can be sequentially solved for the super-resolution pixel signal $l\mu, \nu$, and there is no need to obtain the inverse matrix $M^{-1}, \mu, \mu'$ of the determinant $M\mu, \mu'$, thus making it possible to simplify the arithmetic processing. In this way, x-direction super-resolution processing is performed through steps S310 and S410.

$$L_{0,\nu} = \frac{1}{2}(l_{0,\nu} + l_{1,\nu}) \quad (6a)$$

$$L_{1,\nu} = \frac{1}{3}(l_{0,\nu} + l_{1,\nu} + l_{2,\nu}) \quad (6b)$$

$$L_{i,\nu} = \frac{1}{4}(l_{i-2,\nu} + l_{i-1,\nu} + l_{i,\nu} + l_{i+1,\nu}), i=2 \ldots N_{LF}-2 \quad (6c)$$

$$L_{N_{LF}-1,\nu} = \frac{1}{3}(l_{N_{LF}-3,\nu} + l_{N_{LF}-2,\nu} + l_{N_{LF}-1,\nu}) \quad (6d)$$

Next, in step S320, translation along the angle $\theta b$ is performed for each "y direction only" x-direction pixel shifted image, and multiple y-direction pixel shifted images are generated by performing y-direction non-integral shifting (shifting by the non-integral factor 1/N$\theta$ of the pixel period $\Delta X$). Recurrence formulas similar to those of Expressions (6a) to (6d) hold between the y-direction pixel shifted images and the super-resolution pixel signal $l\mu, \nu$ as well.

In step S420, the recurrence formulas. expressing the relationship between the y-direction pixel shifted images and the super-resolution pixel signal $l\mu, \nu$ are sequentially solved for the super-resolution pixel signal $l\mu$, $v$, and thus an output image (super-resolution pixel signal $l\mu$, $v$) is generated.

Similarly to the first embodiment, in the present embodiment as well, the sampling period in the x direction after super-resolution processing is $\Delta X/N\theta = \Delta x$, which is the same as the sub-pixel period. Accordingly, an output image whose resolution is equal to the effective sub-pixel count. (the factor $Np=N\theta \times N\theta$ of the resolution equal to the effective pixel count) can be generated through the super-resolution processing. Other aspects are similar to those in the first embodiment.

According to the above configuration, a captured image that has a high spatial resolution can be generated from multiple parallax images.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-005661, filed Jan. 13, 2012, which is hereby incorporated by reference herein in its entirety.

The invention claimed is:

1. An image generation method for generating an output image from a plurality of input images captured at a plurality of viewpoints by an image sensor, the method comprising:
a step of generating a plurality of pixel shifted images by performing different shifting for each of the plurality of input images according to a virtual image forming plane that is different from an image sensing plane at which the input images are captured, wherein an amount of pixel shifting is non-integral; and
a step of generating an output image that has a higher resolution than the resolution of the input images from the plurality of pixel shifted images through composition processing.

2. The image generation method according to claim 1, wherein letting Np be the number of different viewpoints, F be an aperture value of an imaging optical system, and $\Delta x$ be a period of sub-pixels of the input images, the distance between the image sensing plane and the virtual image forming plane is less than or equal to $NpF\Delta x$.

3. The image generation method according to claim 1, wherein letting F be an aperture value of an imaging optical system, and $\delta$ be the diameter of a permissible circle of confusion, the distance between the image sensing plane and the virtual image forming plane is less than or equal to a focal depth $F\delta$.

4. The image generation method according to claim 2, wherein an amount of shift in the shifting for each of the plurality of input images is $\Delta x$.

5. A non-transitory computer-readable storage medium that stores a program for causing a computer to execute the steps of the image generation method according to claim 1.

6. An image generation apparatus comprising:
one or more processors configured to:
input a plurality of input images captured at a plurality of viewpoints by an image sensor;
generate a plurality of pixel shifted images by performing different shifting for each of the plurality of input images according to a virtual image forming plane that is different from an image sensing plane at which the input images are captured, wherein an amount of pixel shifting is non-integral; and
generate an output image that has a higher resolution than the resolution of the input images from the plurality of pixel shifted images through composition processing.

7. The image generation apparatus according to claim 6, wherein letting Np be the number of different viewpoints, F be an aperture value of an imaging optical system, and $\Delta x$ be a period of sub-pixels of the input images, the distance between the image sensing plane and the virtual image forming plane is less than or equal to $NpF\Delta x$.

8. The image generation apparatus according to claim 6, wherein letting F be an aperture value of an imaging optical system, and $\delta$ be the diameter of a permissible circle of confusion, the distance between the image sensing plane and the virtual image forming plane is less than or equal to a focal depth $F\delta$.

9. The image generation apparatus according to claim 7, wherein an amount of shift in the shifting for each of the plurality of input images is $\Delta x$.

* * * * *